(12) United States Patent
Tomaru

(10) Patent No.: US 6,188,740 B1
(45) Date of Patent: Feb. 13, 2001

(54) FRACTIONAL-N SYSTEM FREQUENCY SYNTHESIZER AND SYNTHESIZING METHOD AND FIELD PICKUP UNIT USING THE METHOD

(75) Inventor: Fumihito Tomaru, Higashikurume (JP)

(73) Assignee: Hitachi Denshi Kabushiki Kaisha, Tokyo (JP)

( * ) Notice: Under 35 U.S.C. 154(b), the term of this patent shall be extended for 0 days.

(21) Appl. No.: 09/034,295

(22) Filed: Mar. 4, 1998

(30) Foreign Application Priority Data

Mar. 4, 1997 (JP) .................................................... 9-048729

(51) Int. Cl.[7] ..................................................... H03D 3/24
(52) U.S. Cl. .............................................................. 375/376
(58) Field of Search .................... 375/376; 327/147–152, 327/155–161; 331/1 R, 17, 25, 34, 1 A

(56) References Cited

U.S. PATENT DOCUMENTS

| | | | |
|---|---|---|---|
| 3,980,951 | * 9/1976 | Breeze et al. | 455/182.1 |
| 4,199,737 | * 4/1980 | Patterson et al. | 333/154 |
| 4,375,693 | * 3/1983 | Kuhn | 375/376 |
| 4,392,115 | * 7/1983 | Volluet et al. | 333/141 |
| 5,168,248 | * 12/1992 | Konishi | 332/123 |
| 5,319,325 | * 6/1994 | Konishi | 333/17.2 |
| 6,107,843 | * 8/2000 | de Gouy et al. | 327/105 |

OTHER PUBLICATIONS

H. Adachi et al "High–speed Frequency Switching Synthesizer Using Fractional N Phase Locked Loop", Information and Communication Engineers of Japan, vol. J76–C–1, pp. 445–452, Dec. 1993.*

* cited by examiner

*Primary Examiner*—Don N. Vo
(74) *Attorney, Agent, or Firm*—Antonelli, Terry, Stout & Kraus, LLP

(57) ABSTRACT

A fractional-N system frequency synthesizer and a field pickup unit which uses the synthesizer and adapts to a plurality of different channel frequencies in a microwave band. The synthesizer is made up of a fractional control unit which in turn is made up of a modulo-m counter which counts signals of a predetermined frequency fed from a reference oscillator, a channel setting unit for setting a required channel frequency in a predetermined frequency band and for outputting data on the set channel frequency, a memory which stores information on a dividing ratio at an address determined by the count of signals counted by the modulo-m counter and the data on the set channel frequency outputted by the channel setting unit, wherein switching pulses each for selecting a dividing ratio in a dual modulus prescaler are dispersively arranged at equal intervals in the counting period of the modulo-m counter. The field pickup unit is made up of a transmitter and a receiver. A transmission high-frequency unit of the transmitter and a reception high-frequency unit of the receiver each have a fractional-N system frequency synthesizer which frequency-converts an intermediate frequency signal of 1.5 GHz to a signal in a transmission/reception microwave frequency band.

16 Claims, 4 Drawing Sheets

FRACTIONAL-N SYSTEM FREQUENCY SYNTHESIZER AND SYNTHESIZING METHOD AND FIELD PICKUP UNIT USING THE METHOD

FIELD OF THE INVENTION

The present invention relates to a fractional-N system frequency synthesizing method and a fractional-N system frequency synthesizer which can suppress spurious components in the vicinity of an oscillation frequency, and a field pickup unit which can selectively provide a plurality of different channel frequencies for use in digital data transmission and which uses the frequency synthesizer.

DESCRIPTION OF THE RELATED ART

As well known, for example, in television broadcasting, a video signal picked up by a television camera and a voice signal obtained by a microphone are used. In relaying of television broadcasting to a television broadcasting station from the outside, a video/voice signal is required to be transmitted from a relaying point outside the television broadcasting station to the station. To this end, a broadcasting field pickup unit (FPU) is used as the case may be.

Conventionally, a video/voice signal picked-up/collected as an analog signal is transmitted as it is, namely, in an analog signal form. Precently, however, with advancement of digital techniques, the analog video/voice signal is converted to a corresponding digital video/voice signal, which is then transmitted.

Usually, a ground television broadcasting station is authorized to use a radio frequency band assigned for its broadcasting enterprise. A single television broadcasting station is allocated a plurality of different channels (frequency bands) for use in an FPU. Each frequency band width is, for example, about 700 MHz in a 7 GHz band and about 500 MHz in a 10 GHz band.

Thus, there are known FPUs which are each composed of a pair of transmitter and receiver wherein its PLL frequency synthesizer controls a VCO in correspondence to a plurality of channels to thereby select a desired channel.

A conventional FPU which uses a PLL frequency synthesizer to perform analog signal transmission (frequency modulation) will be described next with respect to FIG. 4. The FPU is composed mainly of a transmitter 50 and a receiver 60.

The transmitter 50 is composed of a transmission control unit 51 which receives a video/voice signal to be transmitted and produces an intermediate frequency (IF) signal by frequency-modulating a carrier wave of a predetermined frequency with the received signal; a transmission high-frequency unit 53 which converts the frequency of the IF signal received via a coaxial cable 52 from the transmission control unit 51 and amplifies the power of a transmission signal; a transmission antenna 54 connected to the transmission high-frequency unit 53 for transmitting a power-amplified microwave signal. The transmission high-frequency unit 53 is composed of a TX converter 55 which amplifies the IF signal received via the cable 52 and converts its frequency; a local oscillator 56; a voltage controlled oscillator (VCO) 57; a PLL frequency synthesizer 58; and a power amplifier 59.

The receiver 60 is composed of a receiving antenna 64 which receives the microwave signal transmitted by the transmitter 50; a reception high-frequency unit 63 connected to the receiving antennal 64 for high-frequency amplifying and converting a received signal; a reception control unit 61 for demodulating an IF signal received from the reception high-frequency unit 63 via a coaxial cable 62 and outputting a video/voice signal. The reception high-frequency unit 63 is composed of a high-frequency amplifier 69; an RX converter 65 which converts the frequency of a signal received from the high-frequency amplifier 69 to the IF signal and provides AGC control, a VCO 67, a PLL frequency synthesizer 68 and a local oscillator 66.

In operation, when the FPU is used, for example, for television broadcasting relaying purposes, the receiver 60 is installed within a broadcasting station concerned, whereas the transmitter 50 is set outside the television broadcasting station.

Signals, for example, a video signal picked up by a television camera and a voice signal collected by a microphone and transmitted via the FPU, are inputted to the transmission control unit 51 of the transmitter 50.

The transmission control unit 51 includes a carrier wave oscillator for generating a carrier wave signal of a predetermined frequency and a frequency modulator (both not shown). A carrier wave signal of a predetermined frequency, for example, of 130 MHz produced and outputted by the carrier wave oscillator is frequency-modulated in the frequency modulator with an inputted video/voice signal to provide an IF signal whose carrier wave frequency is 130 MHz, which is then sent via the coaxial cable 52 to the transmission high-frequency unit 53 which converts the frequency of the IF signal and amplifies its power.

The IF signal sent to the transmission high-frequency unit 53 is inputted to the TX converter 55 of the transmission high-frequency unit 53. The TX converter 55 converts the IF signal to a second IF signal, for example, of a carrier wave signal of 1.5 GHz. An oscillation signal of a predetermined frequency delivered by the local oscillator 56 is used as a transmission first local oscillation signal.

The TX converter 55 also converts the carrier wave frequency (1.5 GHz) of the second IF signal to a signal of a microwave band (radio wave band including 7 GHz/10 GHz radio wave) and outputs the obtained microwave and signal to the power amplifier 59.

In this frequency conversion, an oscillation signal of a required frequency fed from the VCO 57 controlled by the PLL synthesizer 58 is used as a transmission second local oscillation signal.

The power amplifier 59 amplifies the microwave band signal fed from the TX converter 55 to a predetermined transmission power, outputs the amplified signal to the sending antenna 54 which transmits the amplified microwave band signal toward the receiver 60.

The receiver 60 receives the microwave band signal transmitted by the transmitter 50 with the receiving antenna 64, and feeds the received signal to the reception high-frequency unit 63. The high-frequency amplifier 69 in the reception high-frequency unit 63 receives and amplifies the microwave band signal to a signal of a required power level and outputs the resulting signal to the RX converter 65, which converts the frequency of the amplified microwave signal to a second IF signal whose carrier wave frequency is 1.5 GHz. In this frequency conversion, an oscillation signal outputted by the VCO 67 controlled by the PLL frequency synthesizer 68 is used as a reception first local oscillation signal.

The RX converter 65 converts the second IF signal of the carrier wave signal of 1.5 GHz to an IF signal whose carrier wave frequency is 130 MHz, which is then delivered via the coaxial cable 62 to the reception control unit 61. In this frequency conversion, the oscillation signal fed from the local oscillator 66 is used as a reception second local oscillation signal.

The reception control unit 61 is provided with a carrier wave oscillator for generating a carrier wave signal of a predetermined frequency and a FM (frequency-modulation) demodulator (both not shown), and FM-demodulates the IF signal, whose carrier wave frequency is 130 MHz, inputted from the RX converter 65 and outputs the resulting video/ voice signal to a succeeding stage device (not shown).

Another conventional FPU which transmits a digital signal will be described next with reference to FIG. 5. At this figure, same reference numerals are used to identify similar components of FIG. 4 and further description thereof will be omitted.

In the transmitter 50, a transmission control unit 71 receives an analog video/voice signal to be transmitted and converts the same to a corresponding digital video/voice signal, and which modulates a carrier wave of a predetermined frequency with the digital video/voice signal in accordance with a predetermined modulation system, for example, in an amplitude modulation system, to produce an intermediate frequency (IF) signal. The transmission high-frequency unit 53 is provided with a crystal oscillator 77 which generates an oscillation signal of a high C/N (carrier wave/noise) ratio, and a frequency multiplier 76.

The receiver 60 is provided with a reception control unit 81 which receives an IF signal from the reception high-frequency unit 63 and demodulates the IF signal to produce an analog video/voice signal. The reception high-frequency unit 63 includes a crystal oscillator 87 which outputs a high C/N ratio oscillation signal and a frequency multiplier 86.

In FIG. 5, the transmission control unit 71 is provided with an A/D converter, a carrier wave oscillator for generating a carrier wave signal of a predetermined frequency, and a modulator of a predetermined modulation system (all of them not shown), and converts a received video/voice signal to a corresponding digital video/voice signal in the A/D converter, modulates the carrier wave signal of a predetermined frequency, for example, of 130 MHz, produced by the carrier wave oscillator, with the digital video/ voice signal in the modulator in accordance with a predetermined modulation system, for example, in accordance with an amplitude modulation system to thereby provide an IF signal of 130 MHz, which is then delivered via the coaxial cable 52 to the transmission high-frequency unit 53 which performs the frequency conversion and power amplification, and more particularly to its TX converter 55.

The local oscillator unit consisting of the crystal oscillator 77 and frequency multiplier 76 of the transmission high-frequency unit 53 is different from the conventional local oscillator unit consisting of the local oscillator 56, VCO 57 and PLL frequency synthesizer 58 described with reference to FIG. 4, and will be described next.

The local oscillator unit which uses a PLL frequency synthesizer (including a one which uses a MSW VCO to be described later in more detail) has a very high output-frequency band, for example, of GHz order, but the fundamental oscillation frequency thereof is low.

Therefore, the phase noise level of the local oscillation signal is high to greatly increase a code error rate which determines the transmission quality of a digital signal.

Thus, in order to prevent a deterioration in the code error rate, a high C/N ratio crystal oscillator 77 is used as a source oscillator, and its output frequency signal is multiplied to a required frequency in the frequency multiplier 76 to thereby provide a desired local oscillation signal.

In the reception high-frequency unit 63 of the receiver 60, its local oscillator unit consisting of the crystal oscillator 87 and frequency multiplier 86 is different from the conventional local oscillator unit consisting of the local oscillator 66, VCO 67 and PLL frequency synthesizer 68 described with reference to FIG. 4, and its operation will be described next.

As in the transmitter 50, in order to prevent the code error rate from increasing due to a high phase noise level of the local oscillation signal, the PLL frequency synthesizer uses the high C/N ratio crystal oscillator 87 as a source oscillator and its output frequency signal is multiplied in the frequency multiplier 86 to a required frequency to thereby provide a desired local oscillation signal.

In the high-frequency amplifier 69, the microwave band signal is amplified to a required level, the RX converter 65 converts the frequency of the microwave band (7 GHz/10 GHz) signal to an IF signal whose carrier wave frequency is 130 MHz, which is then delivered via the coaxial cable 62 to the reception control unit 81.

The reception control unit 81 is provided with a carrier wave oscillator for generating a predetermined frequency signal, a demodulator of a predetermined demodulating system and a D/A converter (all of them not shown). The IF signal of a 130-MHz carrier wave frequency received from the RX converter 65 is demodulated in accordance with the predetermined demodulating system, and converted by the D/A converter to an analog video/voice signal, which is then outputted to another device (not shown).

However, since the frequency of the local oscillation signal is fixed, it is impossible for this system to allow a single FPU consisting of a pair of a transmittor and a receiver to handle a plurality of channels.

A technique which changes an oscillation frequency and reduces phase noise in a conventional frequency synthesizer is disclosed, for example, in Institute of Electronics, Information and Communication Engineers of Japan, Vol. J76-C-1, No. 11, pp. 445–452, December. 1993.

This prior art relates to a frequency synthesizer of a fractional-N system frequency synthesizer. In the technique reducing the ratio of two frequencies to be compared in a phase comparator, namely, the ratio of the oscillation frequency of a VCO to the oscillation frequency of a reference oscillator, or an overall frequency dividing ratio by which the frequency of an original signal generated by the VCO is divided until it finally reaches the phase comparator, is able to suppress an increase in the phase noise.

SUMMARY OF THE INVENTION

In the conventional FPU which uses an ordinary (non-fractional-N system) PLL frequency synthesizer to transmit an analog signal, the dividing ratio for dividing the frequency of the signal from the VCO is required to be set very large so that the frequency to be subjected to phase comparison by the synthesizer be sufficiently low compared to the oscillation frequency in consideration of relationship between an interval of channel frequencies and the operational speed of devices which constitute the phase loop of the PLL frequency synthesizer. This, however, would lead to a further greater increase in the phase noise.

The FPU mentioned above which is composed of a pair of transmitter and receiver for transmitting a digital signal cannot adapt to a plurality of channels.

Further, the conventional fractional-N system frequency synthesizer poses a problem in that it requires a large-scale random number control circuit, and integrating/differential calculating circuits in order to suppress spurious signals attributable to the counting period thereof. Especially, when the frequency synthesizer is used in a microwave band relaying device such as an FPU, a quantity of hardware and power consumption would greatly increase.

It is therefore an object of the present invention to provide a microwave band frequency synthesizer which solves the above problems, and reduces the phase noise, and unnecessary spurious signal components using a relatively small-scale circuit composition.

Another object of the present invention is to provide a fractional-N system frequency synthesizer which is capable of adapting to a plurality of microwave band channel frequencies and performing high-efficiency, high-quality digital transmission, and an FPU using such frequency synthesizer.

In order to achieve the above objects, according to one aspect of the present invention, a fractional-N system frequency synthesizer compares in a phase comparator a signal of a predetermined frequency generated by a reference oscillator and a signal obtained by dividing a signal of a required frequency generated by a voltage controlled oscillator with such a dividing ratio that is switched between different dividing ratios selected in a programmable counter to control the oscillation frequency generated by the voltage controlled oscillator with a phase error signal outputted by the phase comparator. The synthesizer comprises means for dispersively arranging at exactly or substantially equal intervals switching pulses, each of which selects a dividing ratio in the programmable counter, in a counting period of a modulo-m counter (where m is a positive integer) which counts signals generated by the reference oscillator.

According to another aspect of the present invention, a fractional-N system frequency synthesizer comprises a reference oscillator which generates a reference signal of a predetermined frequency, a fractional controller for generating and outputting switching pulses on the basis of the signal of a required frequency generated by the reference oscillator, a voltage controlled oscillator for generating and outputting a signal of a required frequency depending on a control voltage applied thereto, a prescaler for dividing the signal of the required frequency outputted by the voltage controlled oscillator and for outputting a resulting signal, a programmable counter, for example, a dual modulus prescaler, for dividing the signal outputted by the prescaler with a dividing ratio selected out of different dividing ratios by a switching pulse which is outputted by the fractional controller, and a phase comparator for comparing the signal outputted by the reference oscillator and the signal outputted by the dual modulus prescaler with respect to phase to output a control voltage in accordance with a phase error signal representing a difference in phase between those signals. The fractional controller is made up of a modulo-m counter (where m is a positive integer) for counting the signal of the predetermined frequency generated by the reference oscillator, a channel setting unit for setting a required channel frequency in a predetermined frequency band to output the set data on the required channel frequency, and a memory for storing dividing ratio selecting information of the dual modulus prescaler at an address determined by a count representing the number of the signal counted by the modulo-m counter and the set data on the channel frequency outputted by the channel setting unit. Switching pulses each of which selects a dividing ratio in the dual modulus prescaler are dispersively arranged at exactly or substantially equal intervals in the counting period of the modulo-m counter.

According to a further aspect of the present invention, a fractional-N system frequency synthesizer is made up of a voltage controlled oscillator for generating and outputting a signal of a required frequency in accordance with a control voltage applied to the voltage controlled oscillator, a prescaler for frequency-dividing the signal of a required frequency outputted by the voltage controlled oscillator, a dual modulus prescaler responsive to a switching pulse for selecting a dividing ratio out of different dividing ratios and for frequency-diving the signal received from the prescaler with the selected dividing ratio to output a resulting signal, a reference oscillator for generating and outputting a reference signal of a predetermined frequency, a modulo-m counter for counting signals generated by the reference oscillator, a channel setting unit for setting a predetermined channel frequency in a predetermined frequency band and outputting the set data on the channel frequency, a memory for storing dividing ratio selecting information for the dual modulus prescaler at an address determined by a count representing the number of the signal counted by the modulo-m counter and the set data corresponding to the channel frequency outputted by the channel setting unit and for feeding the switching pulse corresponding to the channel frequency to the dual modulus prescaler, and a phase comparator for comparing the phases of the signals outputted by the reference oscillator and the dual modulus prescaler to output a control voltage in accordance with a resulting phase error signal which represents the difference in phase between both the signals, and a loop filter for smoothing the control voltage outputted by the phase comparator and for outputting the smoothed control voltage to the voltage controlled oscillator. Switching pulses each for selecting one dividing ratio out of the different dividing ratios of the dual modulus prescaler are dispersively arranged at exactly or substantially equal intervals within the counting period of the modulo-m counter.

According to a still further aspect of the present invention, a broadcasting FPU uses the inventive fractional-N system frequency synthesizer as a frequency synthesizer for at least one of the transmission high-frequency unit of the transmitter and a reception high-frequency unit of a receiver.

DESCRIPTION OF THE PREFERRED EMBODIMENTS

Before description of an embodiment of a frequency synthesizer according to the present invention and an embodiment of an FPU using the synthesizer, a fractional-N system frequency synthesizer related to the invention will be outlined.

Figure 6:
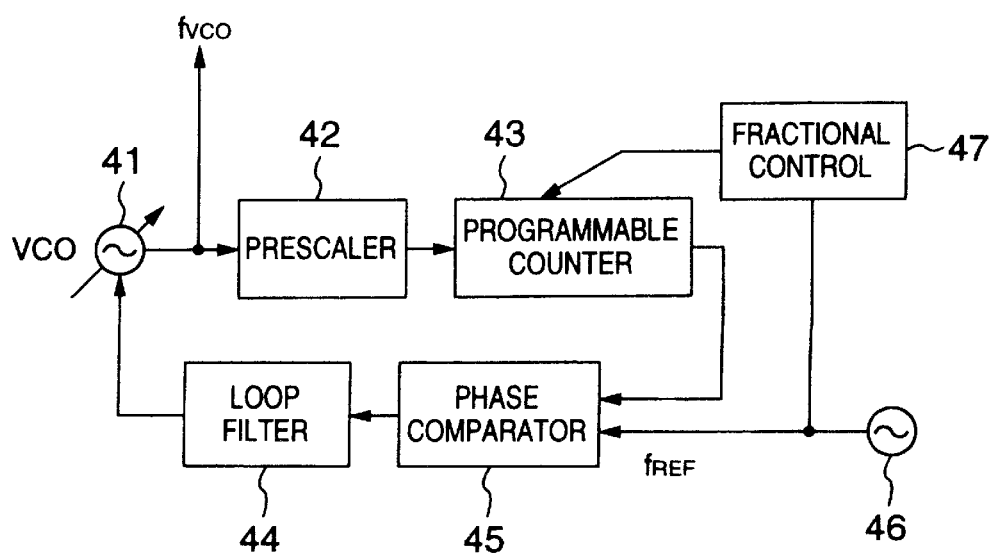
FIG. 6 is a block diagram of a fractional-N system frequency synthesizer useful for explanation of the present invention.

First, the principle of operation of the fractional-N system frequency synthesizer will be described with reference to FIG. 6. An oscillation signal $f_{VCO}$ of a required frequency generated by a VCO (Voltage Controlled Oscillator) 41 is fed as a local oscillation signal outputted by the frequency synthesizer to other circuits such as a converter and is also fed to a prescaler 42 which divides the oscillation signal by a fixed dividing ratio of p (which is a positive integer). The signal outputted by the prescaler 42 is further divided by one of two dividing ratios of N and N+1 (where N is a positive integer) selected by a switching pulse in a dual modulus prescaler (programmable counter) 43 and the resulting signal is outputted to a phase comparator 45.

In addition to the output signal from the dual modulus prescaler 43, the phase comparator 45 receives an oscillation signal $f_{REF}$ of a predetermined reference frequency generated by a reference oscillator 46 and compares the phases of the signals outputted by the dual modulus prescaler 43 and the reference oscillator 46 and outputs a phase error signal indicative of the result of the comparison to a loop filter 44.

The loop filter 44 smooths the phase error signal and outputs the resulting signal as a control signal to a VCO 41 to control its oscillation frequency.

The oscillation signal $f_{REF}$ of the reference frequency generated by the reference oscillator 46 is also delivered as a clock signal to a fractional control unit 47. The fractional control unit counts clock signals from the reference oscillator 46 using its internal modulo-m counter, and feeds to the dual modulus prescaler 43 a switching pulse n times during the time when the modulo-m counter counts m times (m and n are each a positive integer) to thereby switch the dividing ratio from N to N+1 in the prescaler 43.

At this time, the oscillation frequency $f_{VCO}$ of the VCO 41 can be obtained by the following expression (1):

$$f_{VCO}=P\times f_{REF}\times(N+n/m) \quad (1)$$

where $f_{REF}$ is the oscillation frequency of the reference oscillator 46; P, N and m are each a positive integer.

As will be appreciated from in the expression (1), the oscillation frequency $f_{VCO}$ of the VCO 41 can be set with an accuracy of a fraction of n/m for the reference frequency $f_{REF}$, so that a frequency higher than a minimum set frequency unit of the required oscillation frequency $f_{VCO}$ with an accuracy of an integer (not a fraction) is usable as the reference frequency $f_{REF}$.

Assume now that, for example, the dividing ratio of the dual modulus prescaler 43 is a fixed value N. Phase noise in the vicinity of the oscillation frequency of the PLL frequency synthesizer normally deteriorates by a total dividing ratio P×N of the loop of the PLL frequency synthesizer times as much as a quantity of noise in the reference oscillator. Thus, setting the oscillation frequency $f_{REF}$ of the reference oscillator 46 at a highest possible frequency is advantageous to the synthesizer to reduce the phase noise furthermore.

However, the oscillation frequency $f_{REF}$ of the reference oscillator 46 has an upper limit because of relationship between repetition frequency with which the dividing ratio in the dual modulus prescaler 43 is repetitively switched from N to N+1 and N+1 to N and the dividing ratio of the oscillation frequency $f_{VCO}$ of the VCO 41.

For example, the upper limit of the oscillation frequency $f_{REF}$ of the reference oscillator will be calculated about an example of an interval between a plurality of channels allocated to the current FPU (for 7 GHz band). The frequency bands allocated to the FPU in the 7 GHz band are a so-called C band of 6,435–6,561 MHz and a so-called D band of 6,882–7,116 MHz to each of which a channel is allocated at each interval of 18-MHz width.

If a single VCO is to cover both the C and D bands, the upper limit is calculated as 3 MHz because the channel of the highest frequency in the C band and that of the lowest frequency of the D band is separated by 321 MHz and the greatest common measure (minimum set frequency unit) of 18 and 321 MHz is regarded as the upper limit of the oscillation frequency $f_{REF}$ of the reference oscillator.

In the case of control by a non-fractional-N type, PLL frequency synthesizer in a microwave band, the upper limit frequency of 3 MHz is usually required to be divided into frequencies to be used, for example, into less than a switching frequency corresponding to the operational speed of the phase comparator.

Therefore, a prescaler is inserted into the PLL loop. The actual upper limit of the oscillation frequency of the reference oscillator is 3/P MHz where P is the dividing ratio of the prescaler.

If P is 8, the upper limit of the oscillation frequency of the reference oscillator is eventually 375 kHz, and an increase rate of the phase noise at outputting of the VCO output to the phase noise of the reference oscillator is 20×log (7 GHz/375 kHz)=85 dB. Thus, in a modulation system like a 16 QAM where phase information is important, the transmission quality deteriorates due to the influence of the phase noise.

In contrast, in the case of the fractional-N system frequency synthesizer, the oscillation frequency $f_{REF}$ of the reference oscillator 46 can be increased in principle upto about the oscillation frequency of the VCO to thereby minimize a deterioration in the phase noise characteristic.

If the oscillation frequency $f_{REF}$ of the reference oscillator 46 is 30 MHz as an actual value, the increase rate of the phase noise becomes about 47 dB based on a calculation expression similar to that mentioned above, and a quantity of its deterioration is about 1/100 compared to the ordinary PLL frequency synthesizer.

As described above, since the fractional-N system frequency synthesizer is capable of increasing the oscillation frequency $f_{REF}$ of the reference oscillator 46, it is effective for reducing the phase noise of the oscillation frequency $f_{VCO}$ of the VCO 41. However, a spurious component is produced for each frequency of $f_{REF}$/m Hz in a low frequency area due to the counting period of the modulo-m counter. Now, one possible method of suppressing such spurious component will be described.

In the case of a frequency synthesizer whose oscillation frequency is relatively low, in order to suppress the level of such spurious component to thereby prevent a spurious component in a specified frequency from being generated, the switching period of a dual modulus prescaler 43 of the frequency synthesizer is rendered irregular, for example, under random number control or pseudo-random number control.

However, in a microwave band frequency synthesizer for use with the FPU, the oscillation frequency of the reference oscillator 46 (the frequency of a clock signal inputted to the fractional control unit 47) is high, so that a quantity of hardware used for the random number or pseudo-random number control and the power consumption increase greatly, which is unpractical.

Referring to FIGS. 1, 2, 3A, 3B and 7, an embodiment of the inventive frequency synthesizer and an embodiment of an FPU using such synthesizer will be described next.

Similar components are identified with similar reference numerals, and further description thereof will be omitted.

Figure 1:
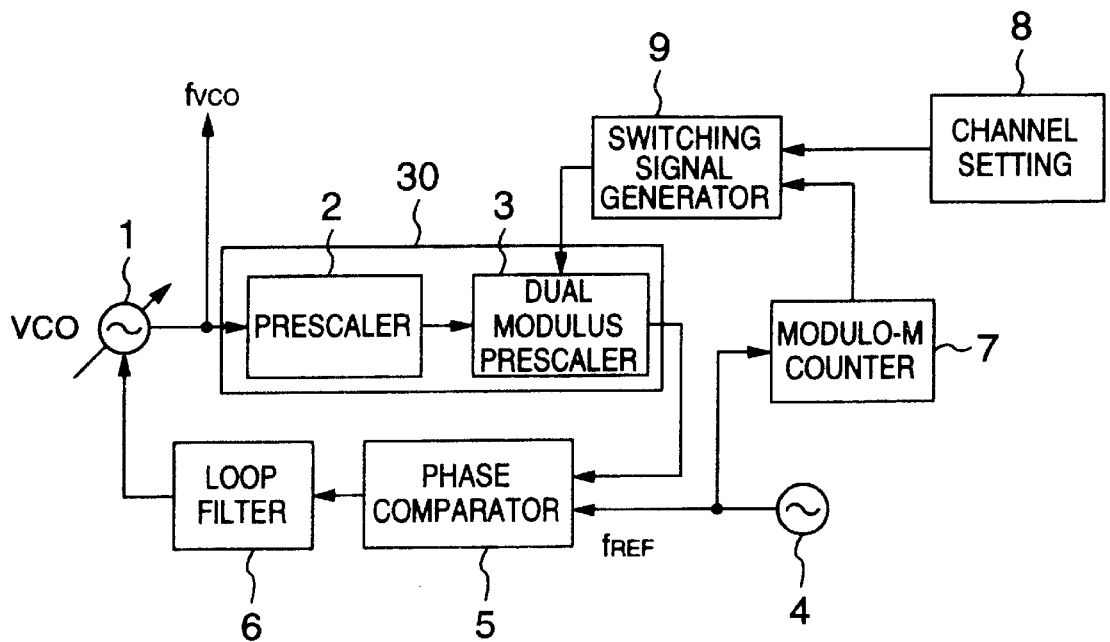
FIG. 1 is a block diagram of a frequency synthesizer according to one embodiment of the present invention.
Figure 2:
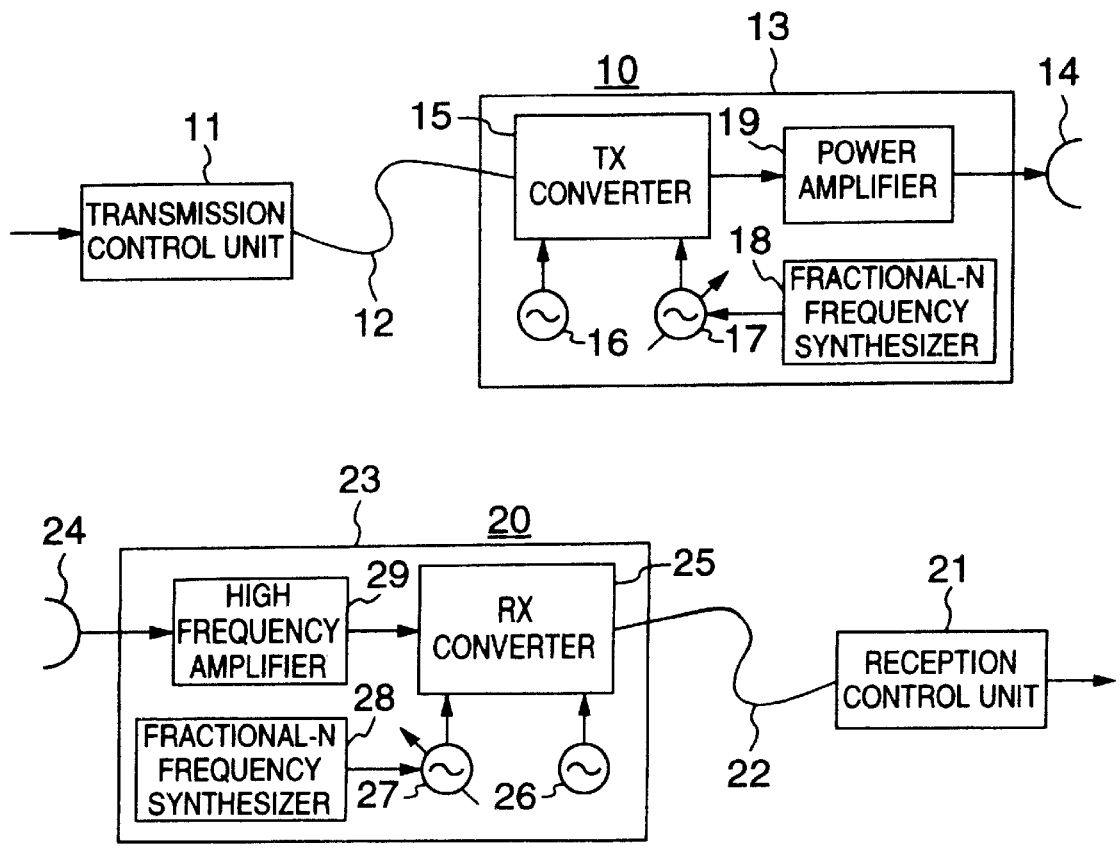
FIG. 2 is a block diagram of an FPU according to another embodiment of the present invention, using the inventive frequency synthesizer.
Figure 3A:
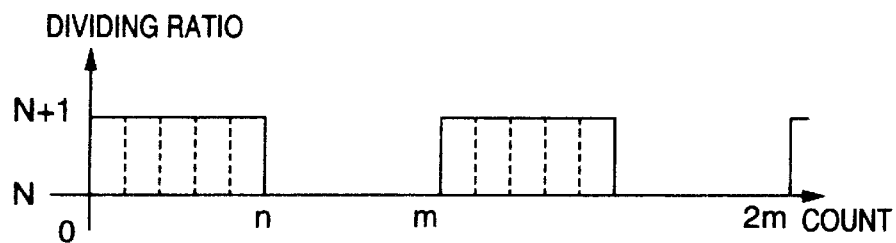
FIGS. 3A and 3B each show a switching pulse pattern of a dual modulus prescaler.
Figure 7:
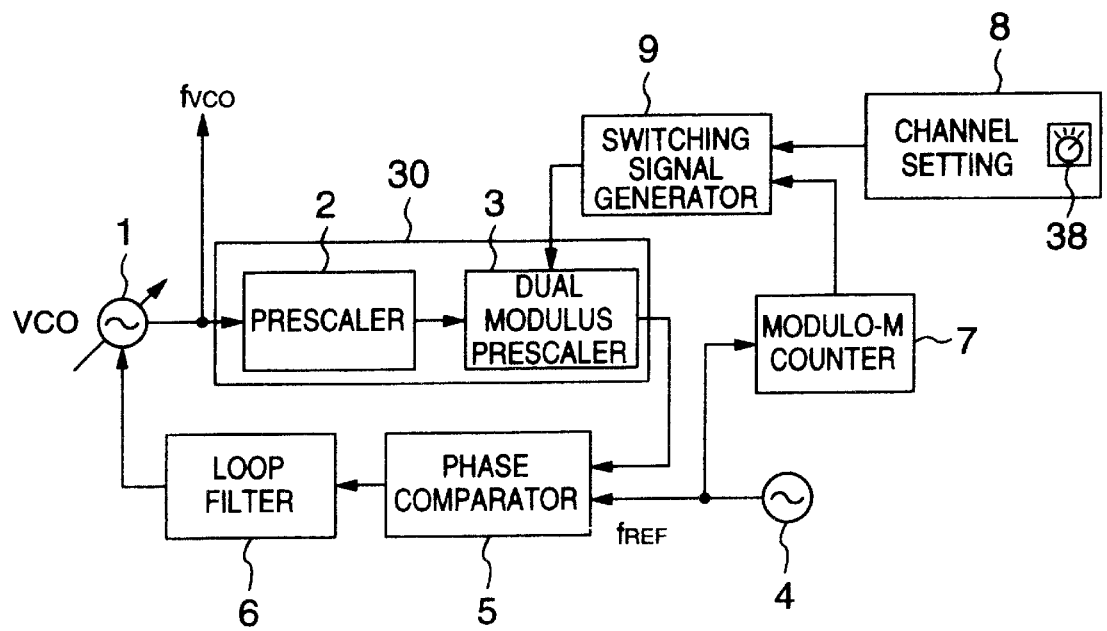
FIG. 7 is a block diagram of a frequency synthesizer in accordance with another embodiment of the present invention.

FIG. 1 is a block diagram of a frequency synthesizer as one embodiment of the present invention. FIG. 2 is a block diagram of an FPU as another embodiment of the present invention, using the inventive frequency synthesizer. FIGS. 3A and B each show a pattern of switching pulses for selecting a frequency dividing ratio in a dual modulus prescaler used in the frequency synthesizer. FIG. 7 is a block diagram of a frequency synthesizer as another embodiment of the present invention.

The frequency synthesizer of FIG. 1 is capable of shifting the spurious components to a maximum possible extent into a higher frequency area. The frequency synthesizer is composed of a VCO (Voltage Controlled Oscillator) 1 which generates a signal of a required frequency, a programmable counter 30 composed of a prescaler 2 which divides the signal generated by the VCO 1 and a dual modulus prescaler 3 which further changeably divides the signal outputted by the prescaler 2 by a dividing ratio selected by a switching pulse, a reference oscillator 4 which generates a reference frequency signal, a phase comparator 5 which phase-compares the signal generated by the reference oscillator 4 and the signal from the dual modulus prescaler 3 and outputs an error signal (phase error signal), a loop filter 6 which smooths the error signal outputted by the phase comparator 5, a modulo-m counter 7 which counts the reference signal generated by the reference oscillator 4, a channel setting unit 8 which sets a channel as a frequency synthesizer, and a switching signal generator 9 including a memory which stores data on the channel set by the channel setting unit 8, the data being used to switch the dividing ratios with equi-intervality, that is, at equal intervals of time or at as equal intervals of time as possible, in correspondence to the count in the modulo-m counter 7.

Figure 3B:
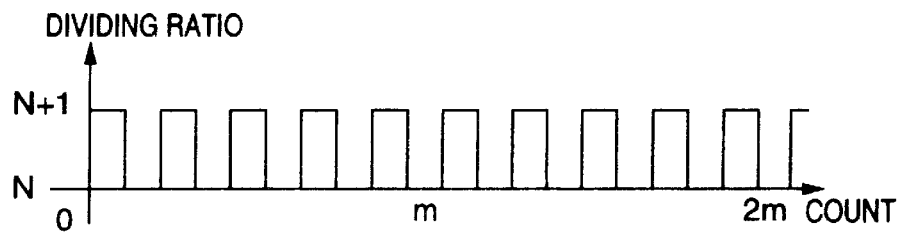
Figure 4:
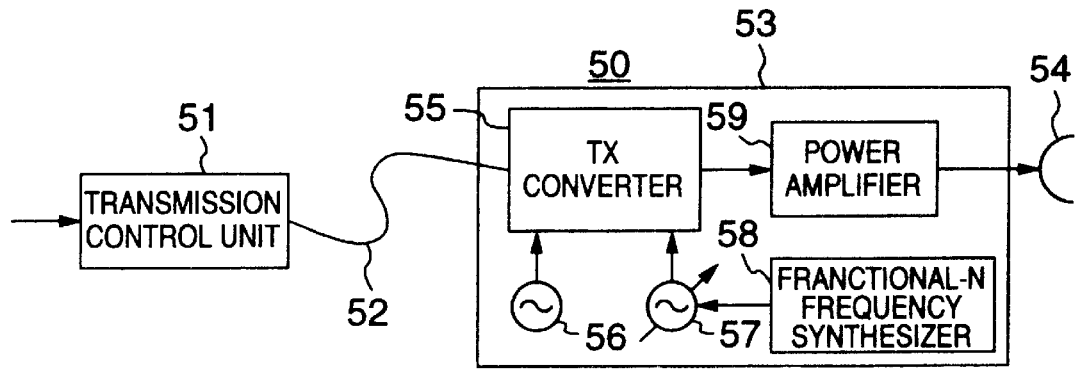
FIG. 4 is a block diagram of a conventional FPU.
Figure 4:
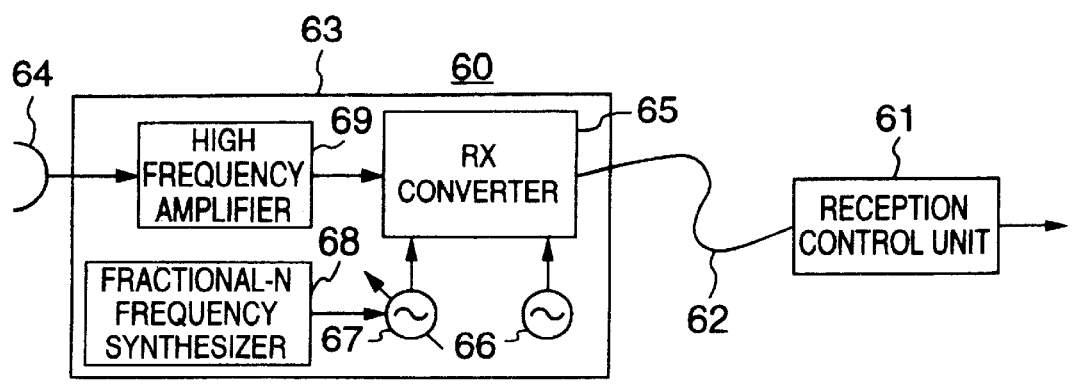
Figure 5:
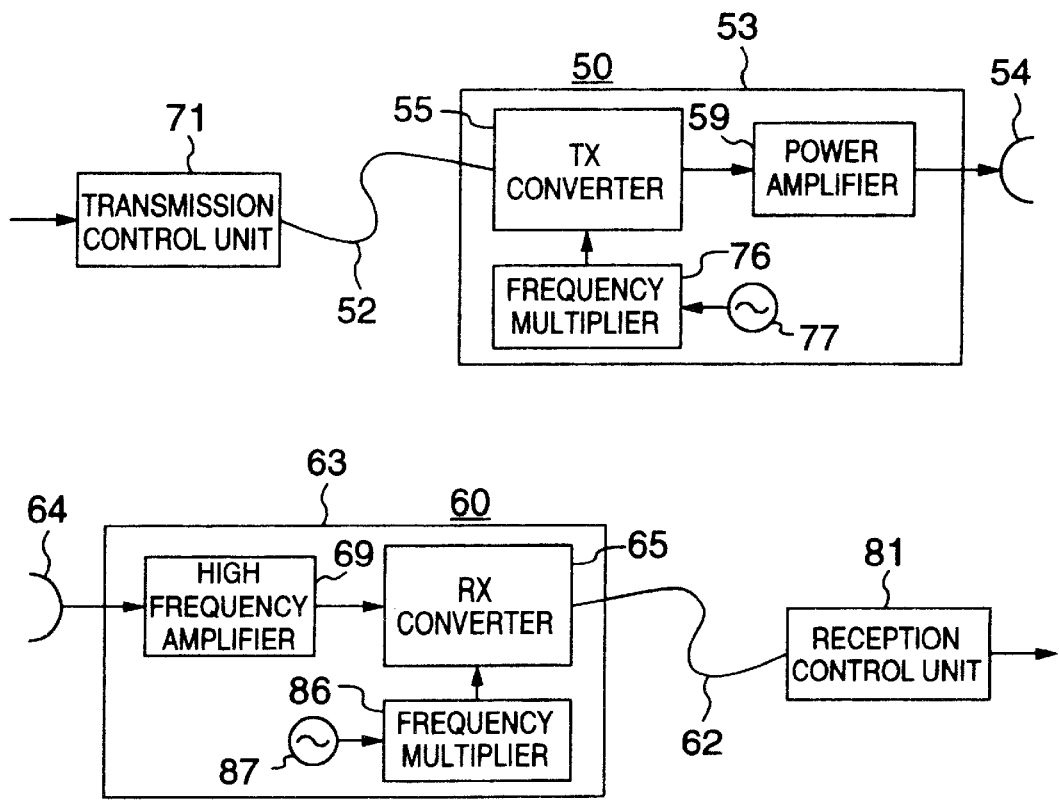
FIG. 5 is a block diagram of another conventional FPU.

FIGS. 3A and 3B each illustrate a pattern of a switching signal for a dividing ratio in the dual modulus prescaler used in the frequency synthesizer. The dividing ratio switching pattern of FIG. 3A has frequency intervals of $f_{REF}/m$ Hz. In this case, spurious signals generated at frequency intervals of $f_{REF}/m$ Hz directly appear on the VCO output.

By using a dividing ratio switching pattern of FIG. 3B where pulses for switching the dividing ratio between N and N+1 are dispersively or arranged at equal intervals of time or at as equal intervals of time as possible within a counter period for counting upto m, without using the dividing ratio switching pattern of FIG. 3A, the spurious components are shifted to a higher frequency area, that is, upto a frequency of $n \times f_{REF}/m$ Hz. In other words, divided periods of time of the dividing ratio of N or N+1 are required to be dispersively arranged at equal intervals of time or at as equal intervals of time as possible within the counter period for which the counter 7 counts from 0 to m. While in the example of FIG. 3B the respective divided pulses are illustrated as dispersively arranged one by one, the pulses may be dispersively arranged in units of a group consisting of two or more divided pulses within each counter period to shift the spurious components to the higher frequency area.

As has been described above, the spurious components are shifted sufficiently to within the higher frequency area where no signal components are present, only the spurious components are suppressed by the loop filter 6, and the signal components are directly passed through the filter.

The frequency synthesizer of FIG. 1 generates the dividing ratio switching pattern of FIG. 3B. The oscillation signal $f_{VCO}$ of the required frequency generated by the VCO 1 is delivered, as a local oscillation signal which the frequency synthesizer outputs, to other circuits such as a converter and the prescaler 2 which divides the local oscillation signal by a fixed dividing ratio P (where P is a positive integer).

The frequency of the output signal from the prescaler 2 is further divided by the dual modulus prescaler 3 which is responsive to switching pulses to allow the dividing ratio to be selected between two dividing ratios of N and N+1 (where N is a positive integer), the resulting output signal divided by N or N+1 is delivered to the phase comparator 5.

In addition to the signal delivered by the dual modulus prescaler 3, the phase comparator 5 receives an oscillation signal $f_{REF}$ of the predetermined reference frequency generated by the reference oscillator 4 to phase-compare those signals, and delivers a phase error signal produced as the result of the comparison to the loop filter 6, which smooths the phase error signal to produce a control signal which is delivered to the VCO 1 to control its oscillation frequency.

The oscillation signal of the reference frequency generated by the reference oscillator 4 is delivered as the clock signal to the modulo-m counter 7, which counts clock signals from 0 to m and delivers its count to the switching signals from 0 to m and delivers its count to the switching signal generator 9 each time the counter 7 counts up one.

The channel setting unit 8 sets a required channel frequency in a predetermined frequency band and delivers data on the set channel frequency to the switching signal generator 9, which uses as an address the count in the modulo-m counter 7 and data on the set channel frequency received from the channel setting unit 8.

As described above, by operating the switching signal generator 9 so that the dividing ratio in the dual modulus prescaler 3 is switched at equal periods of time or at as equal periods of time as possible in correspondence to the count in the modulo-m counter 7, a frequency synthesizer where the spurious components are suppressed is realized.

In order to set respective required channels in a predetermined frequency band in the channel setting unit 8 of the inventive frequency synthesizer to output required channel frequencies in all channels in a stabilized manner, a known MSW VCO (Magneto-Static Wave Voltage Controlled Oscillator) where the VCO 1 employs a magneto-static wave device which is capable of controlling a wide frequency band may be used.

The MSW VCO is a high-Q microwave VCO capable of controlling a wide frequency band and handling an allocated frequency band width with a single VCO. Such MSW VCO is disclosed, for example, in U.S. Pat. No. 5,319,325 entitled "S/M Enhancer" issued to K.Yosihiro, Jun. 7, 1994; U.S. Pat. No. 5,168,248 entitled "Ferri-Magnetic Film Frequency Modulator" issued to K.Yosihiro, Dec. 1, 1997; U.S. Pat. No. 4,392,115 entitled "Volume Magnetostatic Wave Device" issued to Volluet; Gerard et al., Jul. 5, 1983; U.S. Pat. No. 4,199,732 entitled "Magnetostatic Wave Device", issued to Patterson et al., Apr. 22, 1980, the disclosures of which are hereby incorporated by reference.

An embodiment of the inventive fractional-N frequency synthesizer in which the VCO 1 is an MSW VCO will be described with reference to FIG. 7. The channel setting unit 8 includes a rotary channel-setting switch (rotary switch) 38. Parameters P, N and frequency $f_{REF}$ of expression (1) which controls the M.S.W. VCO 1 to cover the C and D bands in the fractional-N system synthesizer of FIG. 7 are calculated as follows:

P=32, N=5, and $f_{REF}$=30 (MHz).

The switching step of frequency $f_{step}$ for frequency $f_{VCO}$ is obtained as follows from the expression (1):

$$f_{step}=1/m \times f_{REF} \times P \quad (2)$$

If the switching step $f_{step}$ is set at 1 MHz, m is given from the expression (2):

$$m=(f_{REF}/f_{step})\times P=30/1\times 32=960$$

As described above, the counter value of m is determined by the reference frequency $f_{REF}$, the switching frequency (step of frequency) $f_{step}$, and the dividing ratio P of the prescaler.

When the channel is to be changed, a frequency is set, for example, using the rotary switch 38. A value corresponding to a channel number is outputted from a CPU (not shown) or the switching signal generator 9 depending on the state of the rotary switch 38. In the C band, seven channels are present at intervals of 18 MHz between 6,435 and 6,561 MHz while in the D band, 13 channels between 6,882–7,116 MHz; that is, 20 channels in all. Thus, information expressing a channel number requires five bits. In the above example, 10 bits are required as information which represents the counting number of m because m is 960.

The dual modulus prescaler 3 is controlled in response to a high pulse or a low pulse outputted from the memory in the switching signal generator 9 which stores the pulse at a 15-bit address of the memory consisting of five bits representing a channel number and 10 bits representing the value of m which are placed as the more and less significant bits, respectively.

Even if switching pulses are arranged at equal intervals of time when the value of n is small, the spurious components may not be shifted sufficiently to within a high frequency area as the case may be. For example, when n is 4 in the above example, the spurious frequency in the vicinity of $f_{VCO}$ is given by $$(f_{REF}/m)\times n$$

which falls within $f_{VCO}\pm 125$ kHz. In this case, by increasing the frequency of $f_{REF}$, the spurious frequency can be shifted to within the high-frequency area. Since the spurious frequency depends on the number of switching operations of the dual modulus prescaler 3, it is required to raise the frequency $f_{REF}$, when $(m-n)\leq m/2$, similarly.

One embodiment of a broadcasting FPU using the inventive frequency synthesizer will be described with respect to FIG. 2. The FPU is mainly composed of a transmitter 10 and a receiver 20.

The transmitter 10 is composed of a transmission control unit 11 which receives a video/voice signal to be transmitted and converts the same to a digital video/voice signal, and modulates a carrier wave of a required frequency with the digital signal to produce an intermediate frequency (IF) signal, a transmission high-frequency unit 13 which converts the frequency of the IF signal received from the transmission control unit 11 via a coaxial cable 12 and amplifies the power of a resulting microwave signal, a transmission antenna 14 connected to the transmission high-frequency unit 13 to transmit the power-amplified microwave signal. The transmission high-frequency unit 13 is composed of a TX converter 15 which amplifies the IF signal delivered from the transmission control unit 11 and converts the frequency of the IF signal, a local oscillator 16, a VCO 17, the inventive fractional-N system frequency synthesizer 18, and a power amplifier 19.

The receiver 20 is composed of a receiving antenna 24 which receives a microwave transmitted by the transmitter 10, a reception high-frequency unit 23 connected to the receiving antenna 24 to high frequency-amplify the received signal and converts this signal to an intermediate frequency (IF) signal, a reception control unit 21 which demodulates the IF signal delivered from the reception high-frequency unit 23 via a coaxial cable 22 to produce an analog video/voice signal. The reception high-frequency unit 23 is composed of a high-frequency amplifier 29, an RX converter 25 which performs frequency conversion and AGC control, a VCO 27, the inventive fractional-N system frequency synthesizer 28 and a local oscillator 26.

In operation, a video signal picked up, for example, by a television camera, and a voice signal picked up, for example, by a microphone, which signals are to be transmitted by the FPU, are delivered to the transmission control unit 11 of the transmitter 10.

The transmission control unit 11 is provided with an A/D converter, a carrier wave oscillator for generating a carrier wave of a required frequency, and a modulator of a predetermined modulation system (both of them not shown). The transmission control unit 11 converts a received analog video/voice signal to a digital video/voice signal in the A/D converter, modulates in the modulator the carrier wave of a required frequency, for example, of 130 MHz, generated by the carrier wave oscillator with the digital video/voice signal in accordance with a predetermined modulation system to produce an IF signal whose carrier wave frequency is 130 MHz. This signal is then sent via the coaxial cable 12 to the transmission-frequency unit 13 for frequency conversion and power amplification.

At this time, a control signal which controls the transmission high-frequency unit 13 and power to be used in the transmission high-frequency unit 13 are superposed on the IF signal and sent via the coaxial cable 12 to the transmission control unit 11.

The IF signal whose carrier wave frequency is 130 MHz is inputted to the TX converter 15 of the transmission high-frequency unit 13, which converts the IF signal with a transmission first local oscillation signal of a required frequency fed by the local oscillator 16 to a second intermediate frequency signal whose carrier wave frequency is, for example, 1.5 GHz.

The TX converter 15 converts the second IF signal using, as a transmission second local oscillation signal, the oscillation signal of a required frequency fed by the VCO 17 which is controlled by the inventive fractional-N system frequency synthesizer, to produce a signal of a microwave band (radiowave band including 7 GHz/10 GHz radiowave), which is then delivered to the power amplifier 19.

The power amplifier 19 amplifies the fed microwave band signal to a required transmission power and then feeds the amplified signal to the transmission antenna 14 which then transmits the microwave signal toward the receiver 20.

Receiving the signal with the receiving antenna 24, the receiver 20 feeds the signal to the reception high-frequency unit 23 and more particularly to its high-frequency amplifier 29, which amplifies the fed signal to a required level and then outputs the resulting signal to the RX converter 25.

The RX converter 25 converts the amplified microwave band signal using, as a reception first local oscillation signal, a signal fed by the VCO 27 which is controlled by the inventive fractional-N system frequency synthesizer 28, to a second IF signal whose carrier wave frequency is 1.5 GHz. The RX converter 25 further converts the second IF signal using, as a reception second local oscillation signal, a signal fed by the local oscillator 26, to an IF signal whose carrier wave frequency is 130 MHz, which is then delivered via the coaxial cable 22 to the reception control unit 21.

The reception control unit 21 is provided with a carrier wave oscillator for generating a carrier wave of a required frequency, a demodulator of a predetermined demodulation system, and a D/A converter (all of them not shown). The reception control unit 21 demodulates the IF signal fed by the RX converter 25 in accordance with the predetermined demodulation system, converts in the D/A converter the demodulated signal to an analog video/voice signal, which is then outputted to other devices (not shown).

At this time, the reception control unit 21 feeds a control signal to control the reception high-frequency unit 23 and power used in the reception high-frequency unit 23 via the coaxial cable 22 to the reception high-frequency unit 23.

According to the above embodiments, the microwave band fractional-N system frequency synthesizer is realized which reduces the phase noise and reduces spurious components, with a relatively simple composition. In addition, an FPU is realized which is capable of handling channel frequencies of a plurality of microwave bands and performing high-efficiency, high-quality digital transmission.

What is claimed is:

1. A fractional-N system frequency synthesizer comprising:
    a reference oscillator for generating a reference signal having a predetermined frequency;
    a modulo-m counter for counting said reference signal from said reference oscillator;
    a voltage controlled oscillator for generating an oscillation signal having a predetermined frequency;
    a switching signal generator coupled with said modulo-m counter for generating a switching signal comprising a plurality of selecting pulses with equi-intervality;
    a programmable counter, to which the output from said voltage controlled oscillator is supplied, for outputting an output signal of a predetermined frequency having a different dividing ratio in response to said switching signal from said switching signal generator; and
    a phase comparator for comparing said output signal from said program counter with said reference signal from said reference oscillator, in order to generate a phase error signal between said output signal from said program counter and said reference signal, the output of said phase comparator being supplied to said voltage controlled oscillator to control the oscillation frequency of said oscillation signal from said voltage controlled oscillator.

2. A fractional-N system frequency synthesizer according to claim 1, wherein said programmable counter comprises a prescaler for frequency-dividing said oscillation signal generated by said voltage controlled oscillator to output a first divided signal, and a dual modulas prescaler having a frequency dividing ratio which switches between different dividing ratios in response to said selecting pulses, for frequency-dividing said first divided signal by said different dividing ratios to output a second divided signal as said output signal of said programmable counter,
    said synthesizer further comprising a channel setting unit responsive to setting of a desired channel frequency in a desired frequency band for outputting data on the set channel frequency, and
    said switching signal generator including a memory for storing dividing ratio selecting information at an address specified by the count outputted by said modulo-m counter and the data on the set channel frequency outputted by said channel setting unit.

3. The fractional-N system frequency synthesizer according to claim 2, further comprising a loop filter for smoothing said output of said phase comparator and for providing the smoothed output to said voltage controlled oscillator.

4. The fractional-N system frequency synthesizer according to claim 2, wherein said voltage controlled oscillator comprises a magnetostatic field voltage controlled oscillator.

5. A frequency synthesizer comprising:
    a reference oscillator for generating a reference signal of a predetermined frequency;
    a voltage controlled oscillator for generating a signal of a predetermined frequency;
    a programmable counter having a frequency dividing ratio which is selectable among different dividing ratios, for frequency-dividing said signal of the predetermined frequency generated by said voltage controlled oscillator by said different dividing ratios to output a resulting signal;
    a phase comparator for phase-comparing said reference signal and said resulting signal outputted by said programmable counter and for outputting a phase error signal indicating a phase difference between said reference signal and said resulting signal outputted by said programmable counter to control said predetermined frequency of the signal generated by said voltage controlled oscillator; and
    a control circuit for controlling said dividing ratio of said programmable counter, said control circuit including a modulo-m counter for counting the reference signal generated by said reference oscillator, and a switching circuit for alternately selecting one of said different dividing ratios of said programmable counter so that a time duration of a particular one of said different dividing ratios is dispersively arranged with equi-intervality within the counting period of said modulo-m counter.

6. A field pickup unit for digital signal transmission, comprising:
    a transmitter comprising a transmission control unit for digitizing inputted information which includes video/voice information and for modulating the digitized information in accordance with a predetermined modulation system to output a modulated signal, a frequency synthesizer for generating a local oscillation signal, a converter for converting a frequency of the modulated signal outputted by said transmission control unit to a signal of a predetermined frequency in a microwave band, using the generated local oscillation signal, and a transmitting antenna connected to an output of said converter for transmitting the signal converted by said converter; and
    a receiver comprising a receiving antenna for receiving a signal of a predetermined frequency in the microwave band, a frequency synthesizer for generating a local oscillation signal, a converter for converting the frequency of the received signal to a signal of a frequency lower than the predetermined frequency, using the local oscillation signal, and a reception control unit for demodulating said signal outputted by said converter in accordance with a predetermined demodulating system and for converting the demodulated signal to an analog signal;
    at least one of said frequency synthesizers of said transmitter and receiver comprising:
        a reference oscillator for generating a reference signal having a predetermined frequency;
        a modulo-m counter for counting said reference signal from said reference oscillator;

a voltage controlled oscillator for generating said local oscillation signal having a predetermined frequency;

a switching signal generator coupled with said modulo-m counter for generating a switching signal comprising a plurality of selecting pulses with equi-intervality;

a programmable counter, to which the output from said voltage controlled oscillator is supplied, for outputting an output signal of a predetermined frequency having a different dividing ratio in response to said switching signal from said switching signal generator; and a phase comparator for comparing said output signal from said program counter with said reference signal from said reference oscillator, in order to generate a phase error signal between said output signal from said programmable counter and said reference signal, the output of said phase comparator being supplied to said voltage controlled oscillator to control the oscillation frequency of said local oscillation signal from said voltage controlled oscillator.

7. A fractional-N system frequency synthesizer according to claim 6, wherein said programmable counter comprises a prescaler for frequency-dividing said local oscillation signal generated by said voltage controlled oscillator to output a first divided signal, and a dual modulas prescaler having a frequency dividing ratio which switches between different dividing ratios in response to said selecting pulses, for frequency-dividing said first divided signal by said different dividing ratios to output a second divided signal as said output signal of said programmable counter, said synthesizer further comprising a channel setting unit responsive to setting of a desired channel frequency in a desired frequency band for outputting data on the set channel frequency, and said switching signal generator including a memory for storing dividing ratio selecting information at an address specified by the count outputted by said modulo-m counter and the data on the set channel frequency outputted by said channel setting unit.

8. The field pickup unit according to claim 7, further comprising a loop filter for smoothing said output of said phase comparator and for providing the smoothed output to said voltage controlled oscillator.

9. The field pickup unit according to claim 7, wherein said voltage controlled oscillator comprises a magnetostatic field voltage controlled oscillator.

10. The field pickup unit according to claim 6, wherein said voltage controlled oscillator comprises a magnetostatic field voltage controlled oscillator.

11. The fractional-N system frequency synthesizer according to claim 1, wherein said voltage controlled oscillator comprises a magnetostatic field voltage controlled oscillator.

12. A field pickup unit for digital signal transmission, comprising:

a transmitter comprising a transmission control unit for digitizing inputted information which includes video/voice information and for modulating the digitized information in accordance with a predetermined modulation system to output a modulated signal, a first frequency synthesizer for generating a first local oscillation signal, a converter for converting a frequency of the modulated signal outputted by said transmission control unit to a signal of a predetermined frequency in a microwave band, using the generated first local oscillation signal, and a transmission antenna connected to an output of said converter for transmitting the signal converted by said converter; and a receiver including a receiving antenna for receiving a signal of a predetermined frequency in the microwave band, a second frequency synthesizer for generating a second local oscillation signal, a converter for converting the frequency of the received signal to a signal of a frequency lower than the predetermined frequency, using the second local oscillation signal, and a reception control unit for demodulating said signal outputted by said converter in accordance with a predetermined demodulating system and for converting the demodulated signal to an analog signal, at least one of said first and second frequency synthesizers of said transmitter and receiver comprising:

a reference oscillator for generating a reference signal of a predetermined frequency;

a voltage controlled oscillator for generating said first or second local oscillation signal of a predetermined frequency;

a programmable counter having a frequency dividing ratio which is selectable among different dividing ratios, for frequency-dividing said first or second local oscillation signal of the predetermined frequency generated by said voltage controlled oscillator by said different dividing ratios to output a resulting signal;

a phase comparator for phase comparing said reference signal and said resulting signal outputted by said programmable counter and for outputting a phase error signal indicating a phase difference between said reference signal and said resulting signal outputted by said programmable counter to control said predetermined frequency of said first or second local oscillation signal generated by said voltage controlled oscillator; and a control circuit for controlling said dividing ratio of said programmable counter, said control circuit including a modulo-m counter for counting the reference signal generated by said reference oscillator, and a switching circuit for alternately selecting one of said different dividing ratios of said programmable counter so that a time duration of a particular one of said different dividing ratios is dispersively arranged with equi-intervality within the counting period of said modulo-m counter.

13. The field pickup unit according to claim 12, further comprising a loop filter for smoothing the phase error signal to provide a control voltage signal to said voltage controlled oscillator.

14. The field pickup unit according to claim 12, wherein said voltage controlled oscillator comprises a magnetostatic field voltage controlled oscillator.

15. A frequency synthesizing method comprising the steps of:

generating a reference signal of a predetermined frequency from a reference oscillator;

generating a signal of a predetermined frequency from a voltage controlled oscillator;

frequency-dividing the generated signal of the predetermined frequency by a dividing ratio which is selectably switched among different dividing ratios in a programmable counter to output a divided signal;

comparing said reference signal of the predetermined frequency and said divided signal in a phase comparator to generate a phase error signal representing a difference in phase between said reference signal and said divided signal; and controlling the oscillation frequency of said voltage controlled oscillator with said phase error signal, the step of frequency-dividing the generated signal of the predetermined frequency including a step of dispersively arranging a plurality of selecting pulses for selecting a particular one of different dividing ratios of the programmable counter with equi-intervality within a counting period of a modulo-m counter.

16. A frequency synthesizing method comprising the steps of:

generating a reference signal of a predetermined frequency from a reference oscillator;

generating a signal of a predetermined frequency from a voltage controlled oscillator;

frequency-dividing the signal of the required frequency by a dividing ratio which is selectably switched between two different dividing ratios in a programmable counter to output a resulting signal;

inputting said reference signal and said resulting signal outputted by said programmable counter to a phase comparator to output a phase error signal indicating a phase difference between said reference signal and said resulting signal; and feeding said phase error signal as a control voltage signal to said voltage controlled oscillator, and the step of frequency-dividing said signal of the required frequency including the step of alternately selecting one of said two different dividing ratios in said programmable counter so that a time duration of a particular one of said different dividing ratios is dispersively arranged with equi-intervality within the counting period of said modulo-m counter.

* * * * *